United States Patent [19]

Kakehi et al.

[11] Patent Number: 4,565,601
[45] Date of Patent: Jan. 21, 1986

[54] METHOD AND APPARATUS FOR CONTROLLING SAMPLE TEMPERATURE

[75] Inventors: Yutaka Kakehi, Hikari; Norio Nakazato, Kudamatsu; Yoshimasa Fukushima, Hikari; Kousai Hiratsuka, Kudamatsu; Fumio Shibata, Kudamatsu; Noriaki Yamamoto, Kudamatsu; Tsunehiko Tsubone, Kudamatsu, all of Japan

[73] Assignee: Hitachi, Ltd., Tokyo, Japan

[21] Appl. No.: 675,863

[22] Filed: Nov. 28, 1984

[30] Foreign Application Priority Data

Nov. 28, 1983 [JP] Japan .............................. 58-166647

[51] Int. Cl.4 ..................... B44C 1/22; C03C 15/00; C03C 25/06; C23F 1/02
[52] U.S. Cl. .................... 156/643; 156/626; 156/646; 156/345; 204/192 E; 204/298
[58] Field of Search ............... 156/643, 646, 345, 626; 204/164, 192 EC, 192 E, 298; 361/234; 279/1 R; 427/38, 39; 118/50.1, 620, 728, 621; 134/1

[56] References Cited

U.S. PATENT DOCUMENTS 4,313,783  2/1982  Davies et al. .................. 156/643
4,384,918  5/1983  Abe .................................. 156/643
4,399,016  8/1983  Tsukada et al. ............... 204/192 R Primary Examiner—William A. Powell
Attorney, Agent, or Firm—Antonelli, Terry & Wands

[57] ABSTRACT

This invention relates to a method and apparatus for controlling temperature of a sample and is intended to prevent a sample from being deformed by the pressure of a heat transmission gas by mounting and fixing the sample being mounted and processed in a vacuum on and to the sample stand and supplying the heat transmission gas to the gap between the under surface of the sample thus fixed and the sample stand; effectively control the temperature of the sample being processed in a vacuum by limiting the size of the gap between the under surface of the sample and the sample stand; and make the heat transmission gas least affect the process by limiting the flow of the heat transmission gas in the vacuum process chamber.

20 Claims, 8 Drawing Figures

METHOD AND APPARATUS FOR CONTROLLING SAMPLE TEMPERATURE

BACKGROUND OF THE INVENTION

1. Field of the Invention

This invention relates to a method and apparatus for controlling sample temperatures, and more particularly to a method and apparatus for controlling the temperature of a sample being processed in a vacuum at a predetermined temperature.

2. Description of the Prior Art

It is one of the important uses of apparatuses such as a dry etching apparatus for processing samples in a vacuum, for instance, utilizing plasma (hereinafter called plasma process) to form minute patterns in the manufacture of minute solid elements, including semiconductor integrated circuits and the like. The formation of such minute patterns is normally carried out by exposing a high polymer material known as photoresist, applied to a semiconductor substrate (hereinafter called substrate) as a sample, to ultraviolet rays and transferring the pattern as a mask obtained by developing it to the substrate by means of dry etching.

The mask and substrate are heated by the collision energy of ions or electrons in the plasma and by the chemical reaction energy during the dry etching for the substrate. Accordingly, unless the substrate temperature is favorably controlled at the time of etching the mask will deform and degenerate because sufficient heat radiation is not possible, thus making it unavailable to be a proper pattern and making it difficult to remove the remaining mask from the substrate after dry etching. To eliminate these disadvantages, techniques for controlling the substrate temperature have been generally employed and proposed. The conventional techniques will be described as follows:

As one of the examples on the prior art, there has been published Japanese Pat. Gazette No. 56-23853. This technique comprises water cooling of a sample stand to which the output of a high frequency power supply is applied, mounting a substrate as a sample on the sample stand through an insulating material, giving a potential difference to the insulating material through plasma by applying d.c. voltage to the electrode, causing the substrate to adhere to the sample stand by means of the electrostatic attraction thus generated and effectively cooling the substrate by reducing heat resistance across the substrate and the sample stand. However, the contact area between the substrate and the insulating material is small even in this technique and there is a small gap therebetween from a microscopic view. Moreover, the processing gas is allowed to enter the gap and it will be converted into heat resistance. In the dry etching apparatus in general, a substrate is normally subjected to dry etching under the processing gas pressure at about 0.1 Torr and, since the gap between the substrate and the insulating material becomes smaller than the mean free path length, reduction in the gap by the electrostatic attraction rarely changes from the heat resistant point; in other words, it will become more effective to the extent that the contact area has been increased. Accordingly, greater electrostatic attraction is required to reduce the heat resistance across the substrate and the sample stand and to cool the substrate more effectively. For this reason, with such techniques, the following problems must be considered.

(1) The time required for conveying the substrate that has been subjected to the etching process tends to increase and the substrate may be damaged because the substrate is difficult to remove from the sample stand.

(2) Although a greater potential difference must be given to the substrate to cause a greater electrostatic attraction to be generated, the greater potential difference allows elements in the substrate to be further damaged and consequently sufficient throughput is unavailable in the delicate process of creating of ever thinner gate films in view of element production.

As another example of the prior art, there has been published Japanese Pat. Gazette No. 57-145321. According to this technique, the substrate is directly cooled by a gas. It is, needless to say, possible to improve cooling efficiency with a cooling gas such as helium (hereinafter called GHe) offering excellent thermal conductivity. However, there are the following disadvantages inherent in that technique:

(1) Even such an inert gas as GHe seriously affects the process because a large amount of cooling gas flows not only on the cooling face of the substrate but also in the process chamber; consequently, it may not be used for the entire process.

As still another example, there has been proposed a technique disclosed by E. J. Egerton et al in Solid State Technology, Vol. 25, No. 8 pp 84~87 (August, 1982). In this technique, GHe at a pressure of 6 Torr is caused to flow between a water cooled sample stand as an electrode and a substrate mounted on and fixed to the electrode by pressing the substrate on the periphery thereof using mechanical clamp means to reduce heat resistance between the electrode and the substrate and effectively cool the substrate.

However, even according to such a technique, the inflow of the GHe to the process chamber will be unavoidable and there are problems similar to those enumerated in the second example and there are the following disadvantages.

(1) Since only the periphery of the substrate is pressed against and fixed to the electrode, the substrate will deform in a convex shape with the periphery being firmly fixed under the pressure of GHe. Consequently, the gap between the under surface of the substrate and the electrode is increased and thermal conductivity across the substrate and the electrode will be reduced; consequently, the substrate is not effectively sufficiently cooled.

(2) Since there is provided mechanical clamp means for pressing and fixing the substrate against and to the electrode, the effective area for preparing elements in the substrate will be reduced and the conveyance of the substrate will become complicated, which will result in increased apparatus size and decreased reliability.

(3) Uniformity of plasma is impaired by the mechanical clamp means.

(4) When the mechanical clamp means operates, products generated by the reaction may fall off the clamp and generate dust, causing serious trouble in processing the substrate.

(5) An uneven distribution of GHe will occur in the gap between the under surface of the substrate and the electrode.

SUMMARY OF THE INVENTION

An object of the present invention is to provide a method and apparatus for controlling sample temperatures, capable of effectively controlling the temperature of the sample to be processed in a vacuum and minimizing the effect of a heat transmission gas on the process.

The present invention employs a control apparatus for controlling the sample temperature comprising means for fixing a sample to be processed in a vacuum to a sample stand; means for supplying a heat transmission gas to the gap between the under surface of the sample fixed thereto by the above means and the sample stand; fixing the sample to be processed in a vacuum to the sample stand by the use of the fixing means; and supplying the heat transmission gas to the gap between the under surface of the sample fixed thereto and the sample stand. Accordingly, the deformation of the sample because of the heat transmission gas is prevented and increase in the size of the gap between the under surface of the sample and the sample stand can be suppressed, and further, the heat transmission gas is prevented from flowing in the process chamber.

DESCRIPTION OF THE PREFERRED EMBODIMENTS

Dry etching, plasma CVD, and spattering apparatuses are known as those used to process samples in a vacuum, for instance, for plasma processing. Embodiments of the present invention will be described by taking the dry etching apparatus as an example.

Figure 1:
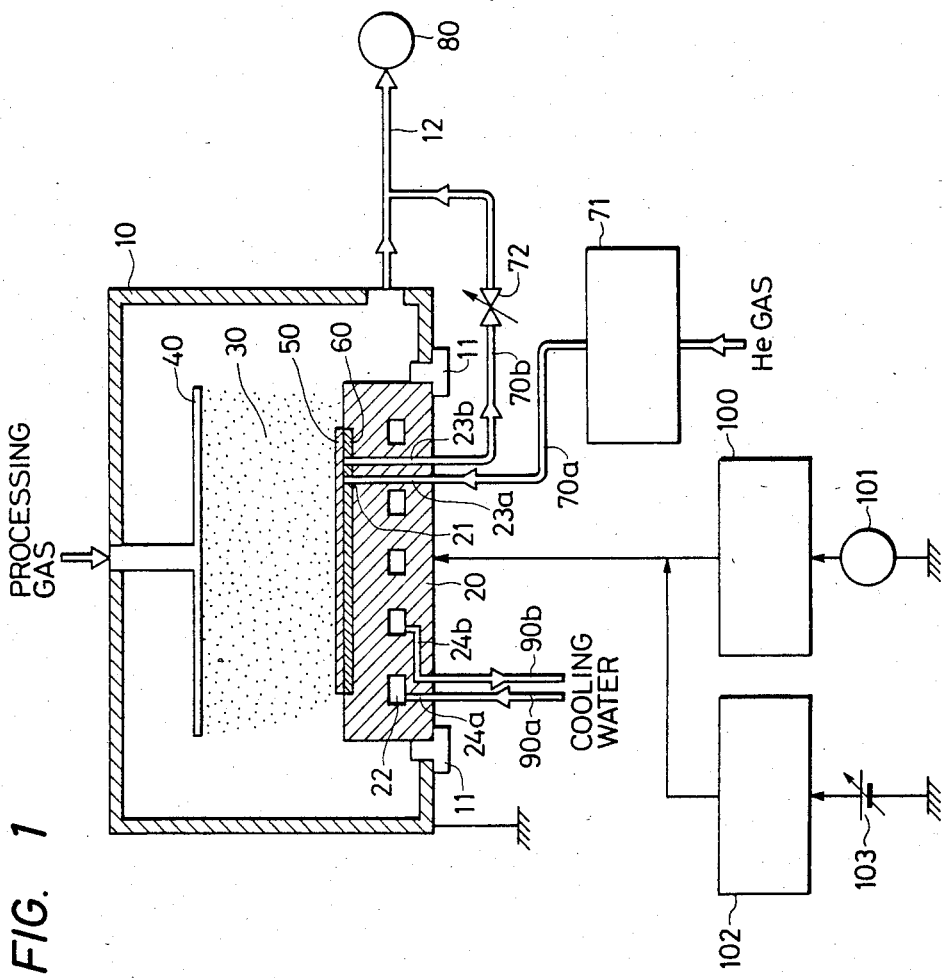
FIG. 1 is a structural view illustrating an example of a dry etching apparatus embodying the present invention.
Figure 2:
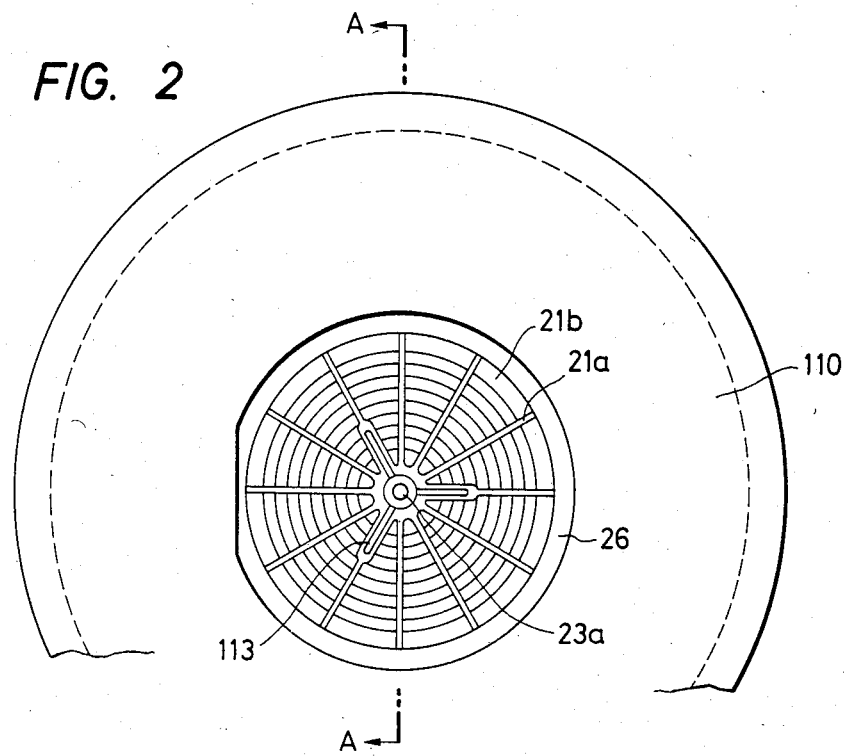
FIG. 2 is a detail top view of the lower electrode of FIG. 1.
Figure 3:
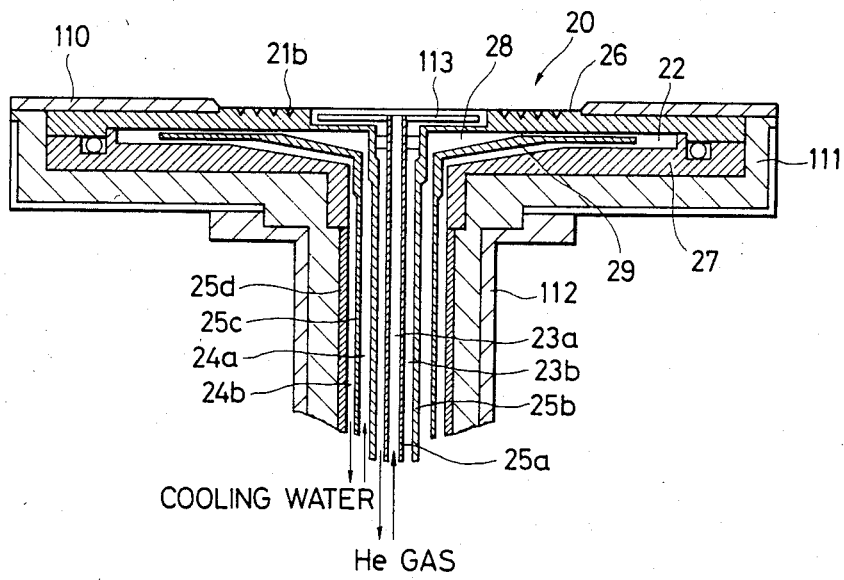
FIG. 3 is a cross sectional view taken on line A—A of FIG. 2.

Referring to FIGS. 1 through 3, an embodiment of the present invention will be described.

In FIG. 1, there is provided a lower electrode 20 as a sample stand on the bottom wall of a process chamber 10 through an insulating substance 11 in an electrically insulated airtight manner. The process chamber 10 is provided with a lower electrode 20, a discharge space 30 and an upper electrode 40 vertically opposite to the lower electrode 20 therein.

An insulating substance 60 in this case is embedded in the surface of the lower electrode 20 corresponding to the under surface of a substrate 50 as a sample. In the insulating substance 60 are formed gas dispersing grooves (not shown) connecting with the discharge space 30 when the substrate 50 is not mounted thereon. There is also formed a cooling medium flow channel 22 in the lower electrode 20, in which a gas supply channel 23a and a gas discharge channel 23b connecting with the gas dispersing grooves are formed, whereas a cooling medium supply channel 24a and a cooling medium discharge channel 24b connecting with the cooling medium flow channel 22 are formed. A conduit tube 70a coupled to a gas source (not shown) is coupled to the gas supply channel 23a and one end of a conduit tube 70b is coupled to the gas discharge channel 23b. The conduit tube 70a is provided with a mass flow controller, hereinafter called MFC, 71, whereas the conduit tube 70b is provided with an adjust valve 72. The other end of the conduit tube 70b is coupled to a discharge conduit tube 12 coupling the process chamber 10 and a vacuum pump 80. A conduit tube 90a coupled to a cool medium source (not shown) is coupled to the cooling medium supply channel 24a and a cooling medium discharge conduit tube 90b is coupled to the cooling medium discharge channel 24b. A high frequency power supply 101 is connected to the lower electrode 20 through a matching box 100 and a dc power supply 103 is also connected thereto through a high frequency cutoff circuit 102. A processing gas discharging aperture (not shown) opening onto the discharge space 30 and a processing gas flow channel (not shown) connecting with the processing gas discharge aperture are formed in an upper electrode 40. A conduit tube (not shown) coupled to a processing gas supply apparatus (not shown) is coupled to the processing gas flow channel. The process chamber 10, high frequency power source 101 and dc power source 103 each are grounded.

Referring to FIGS. 2 and 3, the detailed construction of the lower electrode 20 of FIG. 1 will be described.

The gas supply channel 23a of FIG. 1 is in this case formed with a conduit tube 25a and the conduit tube 25a is made vertically movable with the center of where the substrate is mounted on the lower electrode 20 as an axis. A conduit 25b forming the gas discharge channel 23b of FIG. 1 is arranged on the outer side of the conduit tube 25a. A conduit tube 25c forming the cooling medium supply channel 24a of FIG. 1 is arranged on the outer side of the conduit tube 25b. A conduit tube 25d forming the cooling medium discharge channel 24b of FIG. 1 is arranged on the outer side of the conduit tube 25c. The upper end of the conduit tube 25b is mated with an upper electrode plate 26, whereby a vacant chamber 28 is formed by the upper plate electrode 26, an upper plate electrode support 27, downwardly positioned, and the conduit tube 25b. In the vacant chamber 28 is the cooling medium channel 22 formed by a divider plate 29. The upper end of the conduit tube 25c is joined to the divider plate 29 and the upper end of the conduit tube 25d is joined to the upper plate electrode support 27. A plurality of radial dispersion grooves 21a and that of circular dispersion grooves 21b are formed in the surface of the upper plate electrode 26 on which a substrate (not shown) is mounted. The conduit tubes 25a, 25b are allowed to connect with the dispersion grooves 21a, 21b. The surface of the upper plate electrode 26 where a substrate is mounted is coated with an insulating film (not shown) prepared by applying thereto, a coating of fluoric resin or a similar substance, through electrostatic painting of pulverulent bodies and then burning it onto the surface. As shown in FIGS. 2 and 3, an electrode cover 110 protects the surface of the upper plate electrode 26 while the substrate is not mounted thereon and an insulating cover 111 protects the lower electrode 20 without being covered with the surface of the upper plate electrode 26 with a shield plate 112. Pins 113, or three pins in this case, are arranged at the upper end of the conduit tube 25a at intervals of 120° to support the under surface of a substrate when the substrate is mounted on the upper plate electrode 26 and removed therefrom.

In FIGS. 2 and 3, if the size of the gap between the under surface of the substrate and the bases of the dispersion grooves 21a, 21b is greater than the length of the mean free path of the heat transmission gas, the effect of the heat transmission by the heat transmission gas will be reduced. For this reason, when the substrate is fixed to the lower electrode 20 by electrostatic attraction, as in this case, it is preferred to select the depth of the dispersion grooves 21a, 21b so that the gap between the under surface of the substrate and the bases of the dispersion grooves 21a, 21b may be less than the length of the mean free path of the heat transmission gas. Also, the area of the portion where the under surface of the substrate is electrostatically adhered to the insulating film, hereinafter called the adhering area, should be selected according to the required electrostatic attraction determined by the difference between the heat transmission gas pressure and that in the process chamber 10 to prevent the substrate from lifting off the lower electrode 20 because of the aforementioned difference. Assuming that the heat transmission gas pressure and that in the process chamber 10 are respectively 1 Torr and 0.1 Torr, for instance, the required electrostatic attraction to prevent the substrate from lifting off the lower electrode 20 is about 1.3 g/cm$^2$ and consequently an adhering area to be selected is about 1/5 that of the under surface of the substrate.

In FIGS. 1 through 3, after a substrate 50 is brought into the process chamber 10 by a known carrier means, not shown, the under surface is placed on the lower electrode 20 by mating the surface with an insulating substance 60. A processing gas is then released from an inlet for the gas of the upper electrode 40 into the process chamber 10. High frequency power is applied by the high frequency power supply 101 to the lower electrode 20 after the pressure in the process chamber 10 has been adjusted and a glow discharge is generated across the lower electrode 20 and the upper electrode 40. The processing gas in the discharge space 30 is reduced to plasma because of the glow discharge and an etching process for the substrate is started by the plasma. Simultaneously, dc voltage is applied by the dc power supply 103 to the lower electrode 20. The substrate 50 is electrostatically adhered to the lower electrode 20 and fixed thereto by the self-bias voltage generated by the plasma process and the dc voltage applied by the dc power supply 103 to the lower electrode 20. Then a heat transmission gas such as GHe is supplied to the dispersion grooves 21a, 21b. As a result, heat resistance across the lower electrode 20 cooled by a cooling medium, for instance, cooling water flowing through the cooling medium flow channel 22 and the substrate 50 is reduced and the substrate 50 is effectively cooled. When the etching is almost complete, the supply of GHe to the dispersion grooves 21a, 21b is stopped. Upon the termination of etching, the supply of the processing gas to the discharge space 30 and the application of the high frequency power and dc voltage to the lower electrode 20 are also stopped. The electrostatic attraction being applied to the substrate 50 is subsequently released and the substrate 50 is removed from the lower electrode 20 as the pins 113 are actuated. The substrate 50 is then conveyed out of the process chamber 10 by a known conveyor means.

In this example, the following effects are obtained:

(1) Since not only the periphery of the under surface of the substrate but also the other portion thereof may be used to fix the substrate to the lower electrode, the deformation of the substrate attributable to the pressure of GHe as a heat transmission gas is prevented, so that any increase in the size of the gap between the under surface of the substrate fixed to the lower electrode and the lower electrode can be limited. Accordingly, the deterioration of heat conductive characteristics between the substrate and the lower electrode is prevented, whereby the substrate is effectively cooled.

(2) Since the flow of GHe as a heat transmission gas into the process chamber is limited by the adhering area, the influence of GHe on the process is minimized, so that it can be used for the whole process.

(3) When compared with the prior art comprising employing electrostatic attraction to reduce heat resistance by increasing the contact area of the substrate with the lower electrode, the magnitude of the electrostatic attraction according to this embodiment of the present invention may be sufficient to prevent the substrate from lifting off the lower electrode because of the difference between the pressure of GHe and that in the process chamber. Even if the electrostatic attraction is reduced by decreasing the difference between the pressure of GHe and that of plasma to the extent that the heat resistance across the under surface of the substrate and the lower electrode permits, the effect of cooling the substrate is sufficiently obtainable.

(4) Since only a small amount of the electrostatic attraction is required, the substrate is readily removed from the lower electrode, so that the time required to convey the substrate subjected to the etching process may be shortened with the least damage the substrate.

(5) Since only a small amount of the electrostatic attraction is required, the potential difference given to the substrate is small and damage to the elements within the substrate is also minimized. Accordingly, it is possible to obtain sufficient throughput in view of element production even when thin gate films are precisely processed.

(6) Since the substrate is fixed to the lower electrode not by mechanical clamp means but electrostatic attraction, reduction of the area in the substrate where elements are prepared can be prevented and the substrate is readily conveyed. This will allow the size of the apparatus to be limited and will improve reliability.

(7) Since no mechanical clamp means are used, the uniformity of plasma can be fully maintained.

(8) Since no mechanical clamp means are used, there is no likelihood of generating dust during mounting of the substrate on the lower electrode and removal therefrom.

(9) Because of the dispersion grooves, uneven distribution of the GHe in the gap between the substrate and the under surface of the lower electrode can be prevented.

(10) If the plasma pressure is high, the etching speed may increase as the substrate temperature rises. In that case, GHe is supplied only when the substrate temperature exceeds a preset temperature to increase the cooling effect, so that the time required for etching can be shortened to prevent damage to the photoresist.

Figure 4:
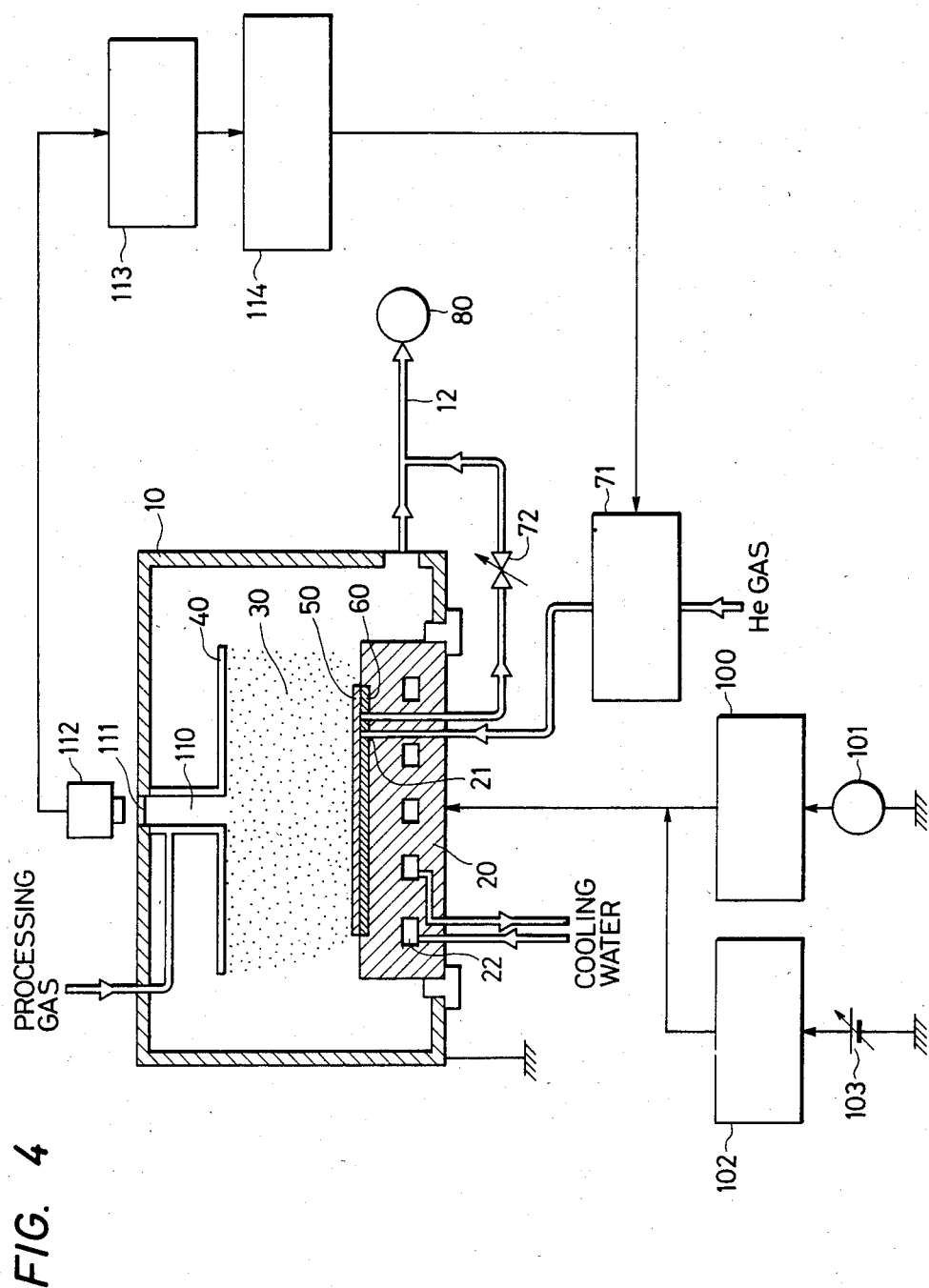
FIG. 4 is a structural view illustrating a second example of the dry etching apparatus embodying the present invention.

FIG. 4 shows a second example of the dry etching apparatus embodying the present invention wherein there is formed a light channel 110 connecting with the exterior of the process chamber 10 and the discharge space in the top wall of the process chamber 10 and the upper electrode 40. A light transmission window 111 is airtightly provided on the outer side of the process chamber 10 of the light channel 110. A thermometer such as an infrared thermometer 112 is provided outside the process chamber 10 corresponding to the light transmission window 111. The output of the infrared is input to a process control computer 114 through an amplifier 113, and a command signal computed by the process control computer 114 is applied to a MFC 71. Like apparatus in FIG. 1 are given like reference characters and description thereof is omitted.

The following effects are further obtainable from this example:

(1) The substrate temperature may be controlled by regulating the quantity of the supply of GHe while the substrate temperature is measured. This control is particularly effective at the time of Al-Cu-Si dry etching and the remnant of the material being etched can be reduced by controlling it at high temperatures to the extent that the photoresist is not damaged.

Figure 5:
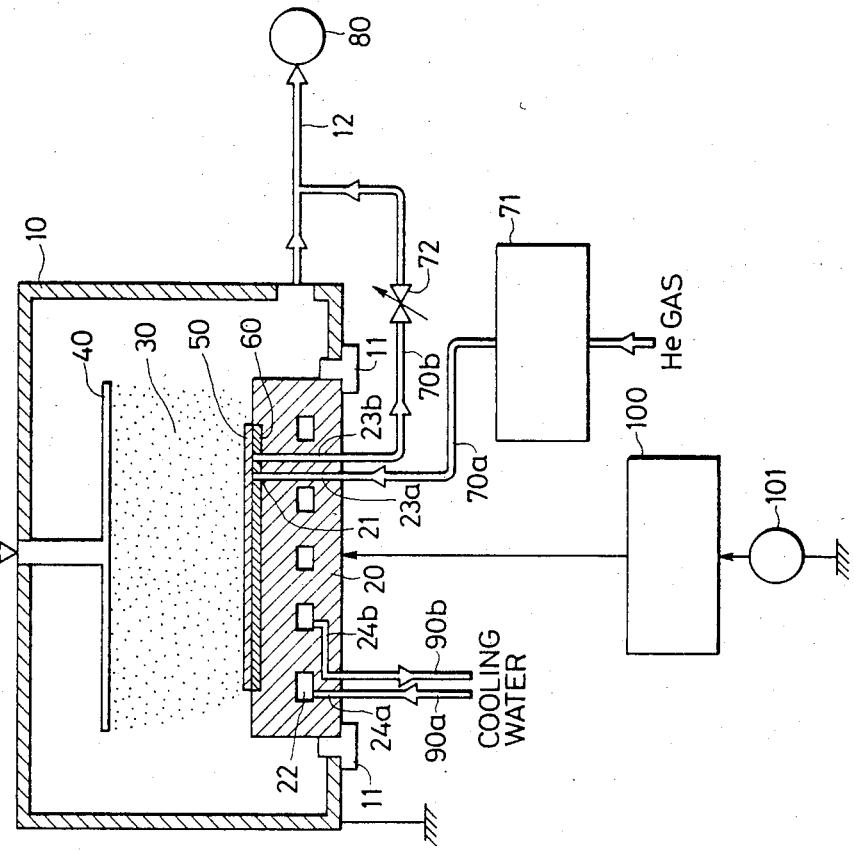
FIG. 5 is a structural view illustrating a third example of the dry etching apparatus embodying the present invention.

FIG. 5 shows a fifth example of the dry etching apparatus embodying the present invention wherein the sole difference from the aforementioned embodiment of FIG. 1 lies in the fact that the dc power supply is not connected to the lower electrode 20 as a sample stand. In this case, the substrate 50 is electrostatically attracted to the lower electrode 20 by the self-bias voltage generated by the plasma process. Like apparatus in FIG. 1 are given like characters and the description thereof is omitted.

The following effects, in addition to what are obtainable from the aforementioned embodiment, can be obtained:

(1) Since the dc power supply and the high frequency cutoff circuit are unnecessary, the construction of the apparatus as a whole is simplified with a consequent reduction in cost.

Figure 6:
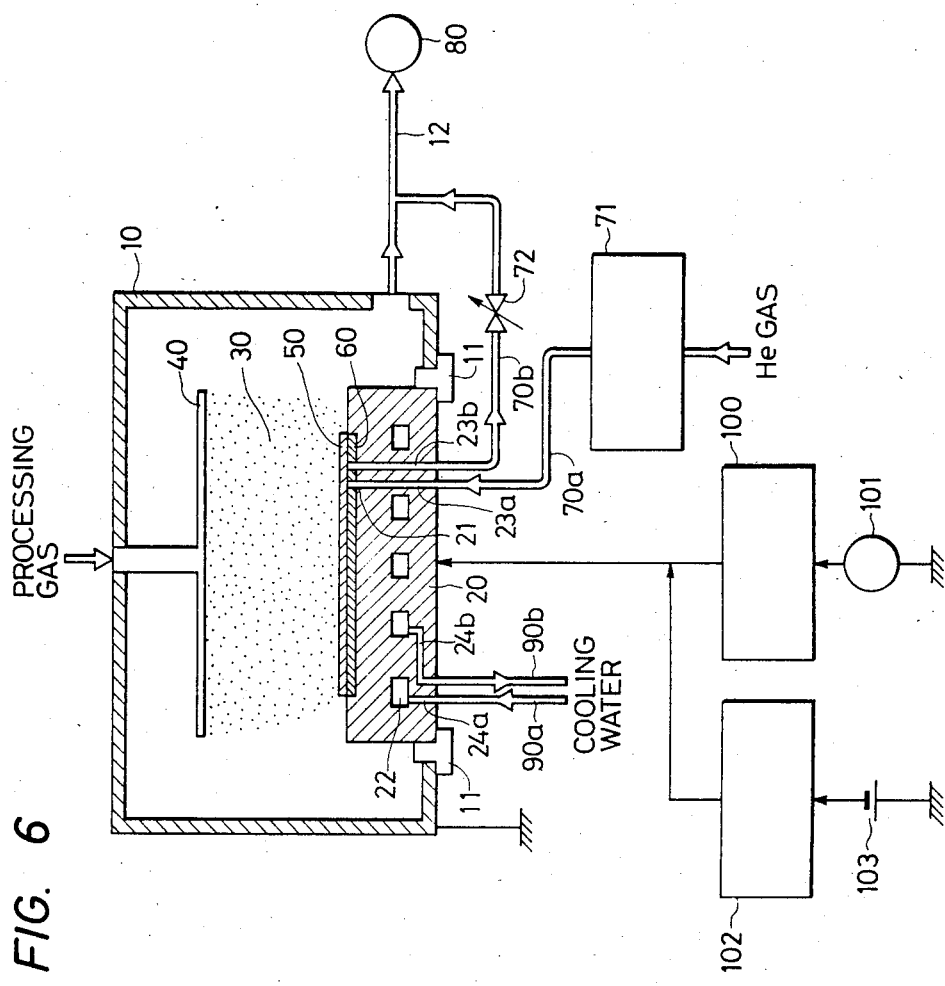
FIG. 6 is a structural view illustrating a fourth example of the dry etching apparatus embodying the present invention.

FIG. 6 shows a fourth example of the dry etching apparatus embodying the present invention wherein the sole difference from the aforementioned embodiment of FIG. 1 lies in the fact that the lower electrode 20 as a sample stand is connected to the dc power supply 103 in such a manner as to enable maintaining the negative potential. Like apparatus in FIG. 1 are given like characters and the description thereof is omitted.

In FIG. 6, the dc voltage from the dc power supply 103 is being applied so as to cancel the negative potential generated in the insulating substance 60 because of the electrons flowing in the substrate 50 from the plasma enabling a potential difference to be given to the insulating substance 60 with the lower electrode 20 as a sample stand as negative potential greater than the self-bias voltage (negative voltage) generated by the plasma process in the absolute value.

The following effects in addition to what are obtainable from the aforementioned embodiment are obtainable.

(1) Since the potential of the lower electrode can be set at a negative one greater than the self-bias voltage generated by the plasma process in the absolute value, electrons in the plasma are prevented from flowing in the lower electrode, so that stable electrostatic adsorption strength may be obtained.

The ion in the plasma has a diameter far greater than that of the electron and the circumference of the lower electrode as a sample stand generates an ion sheath, whereby the ion is rectilinearly incident, for instance, as shown in FIGS. 2 and 3 showing an embodiment of the present invention, it is possible to easily prevent ions from being incident on the lower electrode by means of the electrode cover.

Figure 7:
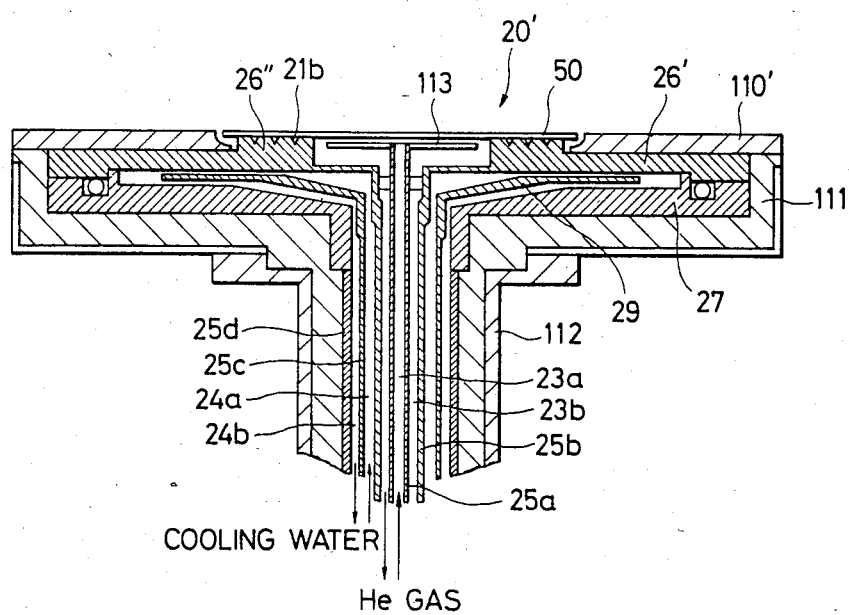
FIG. 7 is a cross sectional view illustrating a fifth example of the dry etching apparatus embodying the present invention, this portion being the same as that of FIG. 3.

FIG. 7 shows a fifth example of the dry etching apparatus embodying the present invention wherein the sole difference from the aforementioned embodiment of FIG. 3 is an elevated stand 26" formed on the portion, where the substrate is mounted, of an upper plate electrode 26' of an lower electrode 20' as well as an electrode cover 110' provided on a portion of the upper plate electrode 26' exposed to plasma and the other portion thereof corresponding to the periphery of the under surface without being exposed to the plasma while the substrate 50 is mounted on the elevated stand 26". The face of the elevated stand 26" has a size such that, when the center of the elevated stand 26" and that of the substrate 50 mounted thereon are roughly coincided, the peripheral edge of the substrate is allowed to protrude slightly from the elevated stand 26". The thickness of the electrode cover 110' on the elevated stand 26" edge side is less than the surface of the insulating film (not shown) of the elevated stand 26". Thickness and shape of the other portion of the elevated stand 26" are limited to the extent that they do not obstruct mounting and removal of the substrate 50. Like parts of FIG. 3 are given like reference characters and the description thereof is omitted.

The following effects in addition to what are obtainable from the aforementioned embodiment can be obtained:

(1) Since it is unnecessary to shunt the electrode cover at the time of the placement and removal of the substrate on and from the elevated stand, the apparatus becomes simple in construction, and reliability for automation is improved. Moreover, it is also possible to prevent substances attached to the electrode cover and produced by reaction from detaching therefrom to become dust. Sufficient throughput can thus be secured even when extremely delicate and precise processing is required.

(2) Since the insulating film is not exposed to plasma, it is possible to prevent reduction in the life of the insulating film because of the bombardment caused by rectilinear ion movement.

Figure 8:
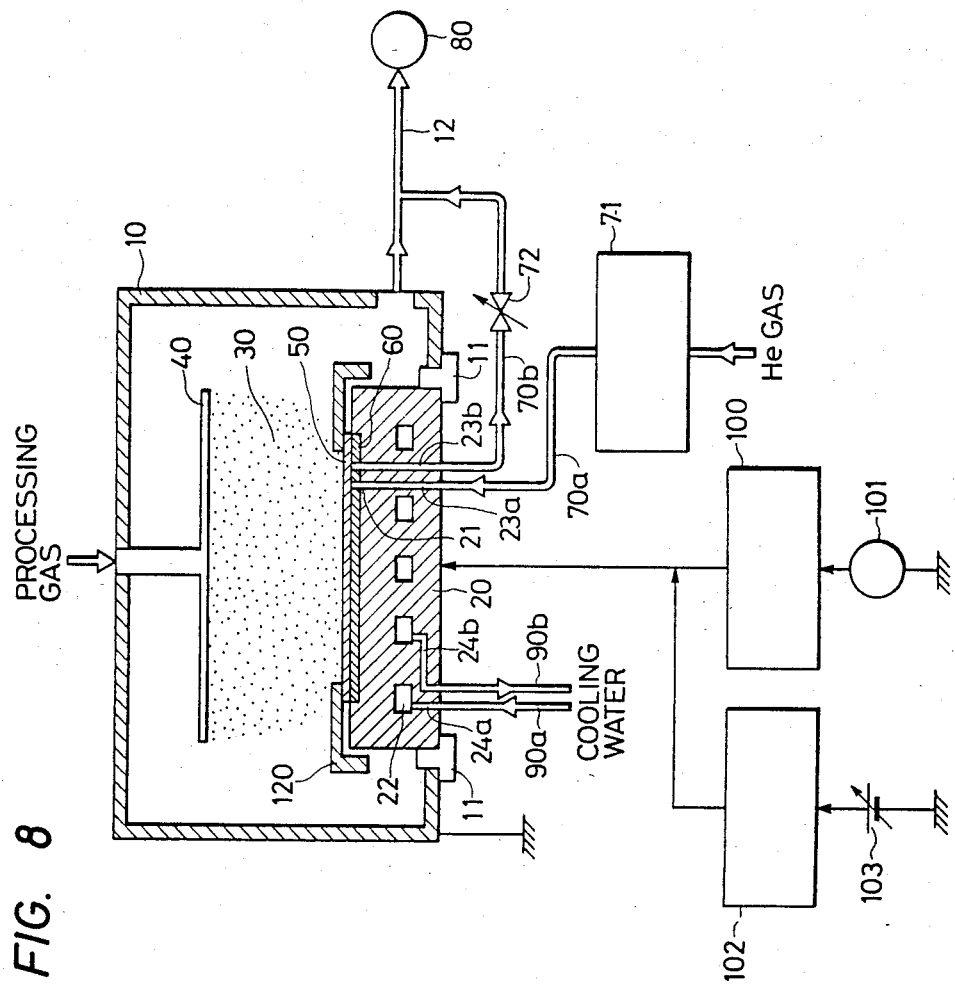
FIG. 8 is a structural view illustrating a sixth example of the dry etching apparatus embodying the present invention.

FIG. 8 shows a sixth example of the dry etching apparatus embodying the present invention wherein the sole difference from the aforementioned embodiment is a tool 120 for pressing the substrate to be fixed to the lower electrode 20 by pressing the periphery of the under surface of the substrate 50 with, for instance, its dead weight. Like apparatus of FIG. 1 are given like reference characters and the description thereof is omitted.

The following effects are further expected:

(1) If the electrostatic attraction should be reduced, the heat transmission gas may be prevented from flowing into the process chamber.

(2) If the electrostatic attraction should be reduced, the substrate is prevented from moving because of the pressure of the heat transmission gas and thus from not being conveyed, so that reliability may be improved.

If the apparatus is so constructed as to allow the lower electrode to be lowered and release the pressure applied by a tool 120 for pressing the substrate, it will facilitate mounting and removal of the substrate on and from the lower electrode as well as conveying it.

In addition to other embodiments as mentioned above, it is also possible to provide the substrate with the electrostatic attraction by arranging the positive and negative poles alternately on the under surface of the insulating substance. When over-etching is carried out after the exposure of the base of the material has been started, the supply of the GHe may be stopped at time when the base of the material has begun to be exposed to inversely apply dc voltage to the lower electrode. In so doing, since electrostatic force remaining in the substrate at the time of the termination of etching can further be reduced, the substrate is prevented from being damaged at the time of conveying the substrate and the time required for conveying the substrate may be shortened. Moreover, other than the GHe as a heat transmission gas, processing gases such as $CF_4$, $SF_6$, $BCl_3$, $CCl_4$ and gases such as hydrogen gas, neon gas may be used. It may also be possible to use high-insulating polymer resins such as para-xylene as well as fluoric resin as an insulating material, the polymer resin being vaporized in a vacuum and formed into a film. In that case, since dielectric breakdown strength more than 10 times greater than that which can be obtained from fluoric resin is obtainable, considerably greater electrostatic attraction will become available. The same effect is also obtained by coating the substrate with a highly dielectric polymer resin such as polyimid resin.

The present invention is also effective in controlling the temperature of a sample mounted on a sample stand subjected to spattering and plasma CVD and pressure reducing CVD or cooled and heated before being processed in a vacuum.

As above described, the present invention employs a temperature control apparatus comprising means for fixing a sample to be processed in a vacuum to a sample stand and means for supplying a heat transmission gas to the gap between the under surface of the sample thus fixed by said means and the sample stand to fix the sample to be processed in a vacuum to the sample stand and supply the heat transmission gas to the gap between the under surface of the sample thus fixed to the sample stand. Accordingly, it becomes possible to prevent the deformation of the sample by the heat transmission gas and limit the increase in the size of the gap between the under surface of the fixed sample and the sample stand and effectively control the temperature of the sample to be processed in a vacuum while preventing the heat transmission gas from flowing into the process chamber and least affecting the process.

What is claimed is:

1. A method for controlling the temperature of a sample comprising electrostatically attracting a sample to be mounted on a sample stand and processed in a vacuum and supplying a heat transmission gas to the gap between the under surface of said sample thus electrostatically attracted and said stand.

2. A method for controlling the sample temperature as claimed in claim 1, wherein said sample is treated by a plasma process, and during the treatment the sample is electrostatically attracted to said sample stand with a self-bias voltage generated by the plasma process and a dc voltage applied to said sample stand.

3. A method for controlling the sample temperature as claimed in claim 1, wherein said sample is treated by a plasma process, and during the treatment the sample is electrostatically attracted to said sample stand using a self-bias voltage generated by the plasma process.

4. A method for controlling the sample temperature as claimed in claim 2, wherein said sample stand carries negative potential greater than said self-bias voltage in the absolute value.

5. A method for controlling the sample temperature as claimed in claim 1, wherein the quantity of said heat transmission gas to be supplied to the gap between the under surface of said sample and said sample stand is adjusted while the temperature of said sample to be processed in a vacuum is measured.

6. A method for controlling the temperature of a sample comprising electrostatically attracting a sample to be mounted on a sample stand and processed in a vacuum to said sample stand, mechanically pressing the periphery of said sample against said sample stand and supplying a heat transmission gas to the gap between the under surface of said sample thus mechanically clamped and said sample stand.

7. A method for controlling the sample temperature as claimed in claim 6, wherein said sample stand is cooled or heated.

8. An apparatus for controlling the temperature of a sample comprising means for electrostatically attracting a sample to be mounted on a sample stand and processed in a vacuum to said sample stand and means for supplying a heat transmission gas to the gap between the under surface of said sample thus electrostatically attracted to said sample stand by said electrostatically attracting means and said sample stand.

9. An apparatus for controlling the sample temperature as claimed in claim 8, further comprising means for subjecting the sample to a plasma process while on said sample stand, and wherein said means for electrostatically attracting said sample comprises an insulating substance provided on said sample stand corresponding to the under surface of said sample to be subjected to the plasma process and a dc power supply connected to said sample stand.

10. An apparatus for controlling the sample temperature as claimed in claim 8, further comprising means for subjecting the sample to a plasma process while on said sample stand, and wherein said means for electrostatically attracting said sample comprises an insulating substance provided on said sample stand corresponding to the under surface of said sample to be subjected to the plasma process.

11. An apparatus for controlling the sample temperature as claimed in claim 9, wherein said dc power supply is connected to said sample stand in a manner as to allow said sample stand to be capable of negative potential.

12. An apparatus for controlling the sample temperature as claimed in claim 8, wherein grooves for dispersing said heat transmission gas are formed in the surface of said sample stand corresponding to the under surface of said sample and the depth of said dispersion grooves are selected in such a manner that the gap between the under surface of said sample electrostatically attracted to said sample stand and the bases of said dispersion grooves is less than the mean free path length of said heat transmission gas.

13. An apparatus for controlling the sample temperature as claimed in claim 12, wherein a plurality of radial and circular dispersion grooves are provided in the surface of said sample stand corresponding to the under surface of said sample.

14. An apparatus for controlling the sample temperature as claimed in claim 8, wherein said means for supplying the heat transmission gas comprises an MFC for adjusting the quantity of said heat transmission gas supplied to said gap, a source of said heat transmission gas and a regulator valve for regulating the quantity of said heat transmission gas discharged from said gap.

15. An apparatus for controlling the sample temperature as claimed in claim 8, wherein said means for supplying the heat transmission gas comprises a source of said heat transmission gas, an MFC for regulating the quantity of said heat transmission gas supplied to said gap, a regulator valve for regulating the quantity of said heat transmission gas discharged from said gap, a thermometer for measuring the temperature of said sample during the process in a vacuum and a computer for controlling the process with said thermometer and said MFC being connected thereto.

16. An apparatus for controlling the sample temperature as claimed in claim 8, wherein said sample stand is provided with an elevated stand where said sample is mounted and a cover is provided on the surface of said sample stand excluding said elevated stand.

17. An apparatus for controlling the sample temperature as claimed in claim 16, wherein when said sample is mounted on said elevated stand in a manner as to make the center of said sample roughly conform to that of said elevated stand, the size of the surface of said elevated stand is such that the peripheral edge of said sample protrudes from said elevated stand; the thickness of the end of said cover facing said elevated stand is made less than the height of said elevated stand; and the thickness and shape of the other portion of said cover are such that they will not impair the placement and removal of said sample on and from said elevated stand.

18. An apparatus for controlling the temperature of a sample comprising means for electrostatically attracting a sample to be mounted on a sample stand and to be processed in a vacuum; means for mechanically pressing the periphery of said sample against said sample stand; and means for supplying a heat transmission gas to the gap between the under surface of said sample electrostatically attracted to said sample stand by said attraction means and mechanically pressed against said sample stand at its periphery, and said sample stand.

19. An apparatus for controlling the sample temperature as claimed in claim 18, wherein said pressing means is a tool for mechanically pressing the periphery of said sample against said sample stand using the dead weight of the tool.

20. A method for controlling the sample temperature as claimed in claim 1, wherein said sample stand is cooled or heated.

* * * * *